United States Patent [19]

Okishi

[11] 4,268,613

[45] May 19, 1981

[54] AGENT FOR PROTECTING THE SURFACE OF LITHOGRAPHIC PRINTING PLATE

[75] Inventor: Yoshio Okishi, Shizuoka, Japan

[73] Assignee: Fuji Photo Film Co., Ltd., Minami-ashigara, Japan

[21] Appl. No.: 51,467

[22] Filed: Jun. 25, 1979

[30] Foreign Application Priority Data

| | | | |
|---|---|---|---|
| Jun. 23, 1978 | [JP] | Japan | 53-76164 |
| Feb. 9, 1979 | [JP] | Japan | 54-13943 |

[51] Int. Cl.[3] .......... G03F 7/02

[52] U.S. Cl. .......... 430/309; 430/331

[58] Field of Search .......... 430/331, 961, 309; 106/2, 14.5

[56] References Cited

U.S. PATENT DOCUMENTS

| | | | |
|---|---|---|---|
| 2,865,873 | 12/1958 | Hodgins et al. | 430/331 |
| 3,019,105 | 1/1962 | Adams | 430/331 |
| 3,525,704 | 8/1970 | Stimson et al. | 430/331 |
| 3,891,439 | 6/1975 | Katz et al. | 430/331 |
| 4,162,920 | 7/1979 | Gillich | 106/14.5 |

*Primary Examiner*—Won H. Louie, Jr.

*Attorney, Agent, or Firm*—Sughrue, Rothwell, Mion, Zinn and Macpeak

[57] ABSTRACT

An emulsion type protective agent for the surface of a lithographic printing plate comprising an aqueous phase having dissolved therein a hydrophilic high molecular weight compound and an oil phase containing an organic solvent, an alkylphenyl type nonionic surfactant having an HLB less than 14, an aliphatic acid ester type surfactant and an anionic surfactant.

43 Claims, No Drawings

AGENT FOR PROTECTING THE SURFACE OF LITHOGRAPHIC PRINTING PLATE

BACKGROUND OF THE INVENTION

1. Field of the Invention

This invention relates to a protective agent for the surface of a lithographic printing plate, especially to an emulsion type plate protective agent.

2. Description of the Prior Art

The final step in the process of making a lithographic printing plate is generally referred to as a gumming step since in this step, the plate is coated with a gumming solution to protect the non-image area (which retains water and repels greasy printing ink). While the primary purpose of gumming is to desensitize, or increase the hydrophilicity of the non-image area of the lithographic printing plate, it has other purposes: that is, to prevent possible deterioration of the lithographic printing plate during the period between making the plate and printing, or over a period in which printing is interrupted; to prevent the non-image area from becoming receptive to printing inks due to sebum on the fingers and other foreign matter during handling of the lithographic printing plate such as when it is set on a printing machine; and to prevent development of scratches and other flaws on the non-image area or image-area (which repels water and accepts printing ink) during handling of the plate.

The inventors of this invention previously found that a plate protective agent which contained an alkylphenyl type nonionic surfactant having an HLB (hydrophile-lipophile balance) and an anionic surfactant in the oil phase of the conventional emulsion type protective agent had the advantage of not reducing the lipophilicity of the image area of a lithographic printing plate. This finding is the subject of copending Japanese Patent Application No. 148519/78. Follow-up research of the present inventors has revealed that the proposed plate protective agent is unable to satisfactorily prevent a decrease in the lipophilicity of the image area when it is applied to "non-washing development", i.e., wherein a developed printing plate is coated with the protective agent without washing with water.

SUMMARY OF THE INVENTION

It is therefore a primary object of this invention to provide a protective agent for a lithographic printing plate which prevents a reduction in lipophilicity of the image area of the plate regardless of whether the development procedure is followed by a washing step.

As a result of various studies in search of an emulsion type gumming solution which achieves the above defined object, it has unexpectedly been found that the aforesaid object can be accomplished by incorporating an alkylphenyl type nonionic surfactant having an HLB less than 14, an aliphatic acid ester type surfactant and an anionic surfactant in the oil phase of the conventional emulsion type gumming solution. Therefore, this invention relates to an emulsion type protecting agent for the surface of a lithographic printing plate comprising an aqueous phase having dissolved therein a hydrophilic high molecular weight compound and an oil phase containing an organic solvent, an alkylphenyl type nonionic surfactant having an HLB less than 14, an aliphatic acid ester type surfactant and an anionic surfactant.

DETAILED DESCRIPTION OF THE INVENTION

The aliphatic acid ester type surfactant used in the present invention is preferably an ester of a saturated or unsaturated aliphatic acid having 12 to 18 carbon atoms and preferably 16 to 18 carbon atoms and a polyhydroxy alcohol having preferably 3 to 6 carbon atoms and 2 to 4 hydroxy groups (e.g., sorbitol, sorbitan, glycerol, etc., and has 1 to 3 and preferably 1 aliphatic acid moiety per surfactant. Typical examples of the aliphatic acid ester type surfactant include a sorbitan ester of aliphatic acids such as sorbitan monopalmitate, sorbitan monostearate, sorbitan tristearate, sorbitan monooleate and sorbitan trioleate; a glycerin ester of aliphatic acids such as monoglyceride stearate, monoglyceride oleate, glycerol monostearate, or glycerol monooleate. Preferred examples are sorbitan monooleate, sorbitan monostearate, and monoglyceride stearate.

The alkylphenyl type nonionic surfactant having an HLB less than 14 is preferably a compound which is represented by the following formula (I) and has an HLB less than 14:

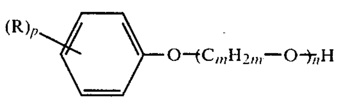

(I)

wherein R is an alkyl group; p is 1 or 2; m is an integer of 1 to 4; and n is an integer of 2 or more.

The alkyl group as R preferably has 8 to 18 carbon atoms, such as an octyl group, nonyl group, decyl group, undecyl group, dodecyl group, lauryl group), tetradecyl group and hexadecyl group (cetyl group). The most preferred alkyl groups are an octyl group and a nonyl group. While, R is generally in the para position with respect to the group $-O-(C_mH_{2m}-O)_nH$, it may be in the meta or ortho position. A preferred number for p is 1, and that for m is 2. While n represents a different number according to the number of carbon atoms in the alkyl group R, it is within such a range that the value of HLB is less than 14, and preferably it is in the range of from 4 to 12 and, most preferably, from 7 to 12. A protective agent using an alkylphenyl nonionic surfactant having an HLB larger than 14 is not desired because it reduces the lipophilicity of the image area of a lithographic printing plate.

Specific examples of the alkylphenyl type nonionic surfactant having an HLB less than 14 include polyoxymethylene octylphenyl ether, polyoxymethylene nonylphenyl ether, polyoxymethylene cetylphenyl ether, polyoxymethylene laurylphenyl ether, polyoxyethylene octylphenyl ether, polyoxyethylene nonylphenyl ether, polyoxyethylene decylphenyl ether, polyoxyethylene laurylphenyl ether, polyoxypropylene octylphenyl ether, polyoxypropylene nonylphenyl ether, polyoxypropylene decylphenyl ether, polyoxypropylene laurylphenyl ether, polyoxypropylene cetylphenyl ether, polyoxybutylene octylphenyl ether, polyoxybutylene nonylphenyl ether, polyoxybutylene decylphenyl ether, polyoxybutylene laurylphenyl ether, polyoxybutylene cetylphenyl ether, and polyoxyethylene dinonylphenyl ether, all these examples having an HLB less than 14. Particularly advantageous to the purpose of this invention are of polyoxyethylene type such as polyoxyethylene nonylphenyl ether and polyoxyethylene octylphenyl ether.

The anionic surfactant used in the present invention is exemplified by aliphatic acid salts (preferably salts of an acid having 8 to 22 carbon atoms), salts of alkylsulfate esters (preferably salts of straight chain or branched chain alkyl esters having 8 to 18 carbon atoms), alkylbenzenesulfonates (in which the alkyl moiety is a straight chain or branched chain and preferably has 8 to 18 carbon atoms), alkylnaphthylenesulfonates (in which the alkyl moiety is straight chain or branched chain and preferably has 3 to 10 carbon atoms), salts of dialkylsulfosuccinate esters (in which the alkyl group is straight chain or branched chain and has 2 to 18 carbon atoms such as a sec-butyl group, a tert-butyl group, a hexyl group, a 2-ethylhexyl group, a nonyl group, a decyl group, and a dodecyl group), salts of alkyl phosphate esters (in which the alkyl moiety is straight chain or branched chain and preferably has 8 to 18 carbon atoms), condensates of naphthylenesulfonic acid with formalin and salts of polyoxyethylene alkyl sulfate esters (preferably having up to 6 polyoxyethylene units and a straight chain or branched alkyl moiety having 8 to 18 carbon atoms). The most preferred anionic surfactant is a salt of a dialkylsulfosuccinate.

A plate protective agent containing a combination of an alkylphenyl type nonionic surfactant, an aliphatic acid ester type surfactant and an anionic surfactant defined above prevents a decrease in the lipophilicity of an image area whereas a protecting agent containing only one type of surfactant independently, whether or not the development procedure is followed by a washing step does not prevent a decrease in the lipophilicity as well. A combination of an alkylphenyl type nonionic surfactant and an aliphatic acid ester type surfactant or a combination of an aliphatic acid ester type surfactant and an anionic surfactant is not as effective as the combination of three types of surfactant in minimizing the decrease in the lipophilicity of the image area. A combination of alkylphenyl type nonionic surfactant and anionic surfactant decreases the lipophilicity of the image area if a developed plate is gummed without water-washing.

The sum of the three types of surfactant to be used in this invention is in the range of from about 1 to about 15 wt%, preferably from 1 to 10 wt%, based on the total weight of the surface protecting agent. The proportion of the alkylphenyl type nonionic surfactant to anionic surfactant is within the range of from 10:1 to 1:10, preferably from 5:1 to 1:5, by weight. The proportion of the alkylphenyl type nonionic surfactant to aliphatic acid ester type surfactant is within the range of from 10:1 to 1:10, preferably from 5:1 to 1:5, by weight.

The above defined three types of surfactant are dissolved in an organic solvent to make the oil phase of the surface protective agent of this invention. A preferred organic solvent is insoluble in water, and includes solvents such as a hydrocarbon typified by turpentine oil, xylene, toluene, n-heptane, solvent naphtha, kerosine, mineral spirit, a petroleum fraction having a boiling point of from about 120° to about 250° C.; a plasticizer which solidifies at less than 15° C. and boils at more than 300° C. at one atmosphere such as a phthalic acid diester typified by dibutyl phthalate, diheptyl phthalate, di-n-octyl phthalate, di(2-ethylhexyl) phthalate, dinonyl phthalate, didecyl phthalate, dilauryl phthalate, and butylbenzyl phthalate, an aliphatic ester of dibasic acids typified by dioctyl adipate, butylglycol adipate, dioctyl azelate, dibutyl sebacate, di(2-ethylhexyl)-sebacate, and dioctyl sebacate, an epoxidized triglyceride such as epoxidized soybean oil, a phosphate ester such as tricresyl phosphate trioctyl phosphate and trischloroethyl phosphate, and a benzoic ester such as benzyl benzoate.

These solvents may be used in combination with an aliphatic ketone such as cyclohexanone, an aliphatic halide such as ethylene dichloride, and an ethylene glycol ether such as ethylene glycol monomethyl ether, ethylene glycol monophenyl ether, or ethylene glycol monobutyl ether.

These solvents are used in an amount within the range of from about 0.1 to about 10 wt%, preferably from 0.5 to 5 wt%, based on the total weight of the plate protective agent.

The oil phase of the protective agent according to this invention preferably contains dissolved therein a lipophilic substance for the purpose of enhancing the stability of the protective agent in emulsified state and minimizing the potential decrease in the lipophilicity of the image area. A preferred lipophilic substance is one of those which is conventionally used as a vehicle for lithographic printing ink. Specific examples of the suitable lipophilic substance include a novolak phenolic resin such as a phenol-formaldehyde resin, cresol-formaldehyde resin or tert-butylphenyl-formaldehyde resin; a xylene resin prepared by condensing phenol and xylene with formaldehyde; a resin prepared by condensing phenol and mesitylene with formaldehyde; polyhydroxystyrene; bromated polyhydroxystyrene; cashew resin; partial esterified product of a copolymer of styrene and maleic anhydride; melamine resin; alkyd resin; polyester resin; epoxy resin; rosin or modified rosin such as hydrogenated rosin or rosin ester; and a petroleum resin such as gilsonide. A novolak phenolic resin, rosin or modified rosin are preferred. Other examples of the suitable lipophilic substance include an organic carboxylic acid having 5 to 25 carbon atoms such as oleic acid, lauric acid, valeric acid, nonylic acid, capric acid, myristic acid and palmitic acid, as well as castor oil. Whether used independently or as a mixture, these lipophilic substances are used in an amount within the range of from about 0.05 to about 5 wt%, preferably from 0.1 to 1 wt%, based on the total weight of the plate protective agent.

The hydrophilic high molecular weight compound contained in the aqueous phase of the plate protective agent according to this invention functions to protect the non-image area of a lithographic printing plate and it is preferably composed of a film-forming hydrophilic resin. Examples of the suitable film-forming hydrophilic high molecular weight compound are dextrin, gum arabic, an alginate such as sodium alginate, a water-soluble cellulose such as carboxymethylcellulose, hydroxyethylcellulose or methylcellulose, polyvinyl alcohol, polyvinyl pyrrolidone, polyacrylamide, a water soluble copolymer containing an acrylamide unit, a copolymer of vinyl methyl ether and maleic anhydride, or a copolymer of vinyl acetate and maleic anhydride. Particularly preferred are gum arabic, dextrin, polyvinyl pyrrolidine, carboxymethylcellulose and polyvinyl alcohol. Gum arabic is most preferred. These film-forming hydrophilic high molecular weight compounds are used independently or as a mixture. Of special advantage is a gum arabic and dextrin combination which is able to enhance the hydrophilicity of the non-image area without reducing the lipophilicity of the image area. While these hydrophilic high molecular weight compounds may be contained in the aqueous phase in a wide range of concentrations, they are generally used in an amount within the range of from about 5 to about 40 wt%, preferably from 10 to 30 wt%, based on the total weight of the plate protective agent, and their concentration in the aqueous phase is in the range of from about 6 to about 60 wt%, preferably from 15 to 50 wt%.

The aqueous phase of the plate protective agent according to this invention preferably contains a wetting agent for the purpose of allowing the aqueous phase to spread to the non-image area of the lithographic printing plate at suitable rate. A preferred wetting agent is polyhydric alcohol, which is specifically exemplified by ethylene glycol, diethylene glycol, triethylene glycol, propylene glycol, butylene glycol pentanediol, hexylene glycol, tetraethylene glycol, polyethylene glycol, dipropylene glycol, tripropylene glycol, glycerin, sorbital or pentaerythritol. Glyerin is most preferred. These wetting agents are used in an amount of from about 0.5 to about 10 wt%, preferably from 1 to 5 wt%, based on the total weight of the plate protective agent.

The aqueous phase of the plate protective agent according to this invention preferably contains a water-soluble salt for the purpose of enhancing the hydrophilicity of the non-image area of a lithographic printing plate when it is coated with the plate protective agent. Advantageous water soluble salts include an alkali metal salt and ammonium salt; particularly advantageous are water-soluble alkali metal salts and ammonium salts of acids such as acetic acid, molybdic acid, boric acid, nitric acid, sulfuric acid, phosphoric acid and polyphosphoric acid. Specific examples are ammonium acetate, sodium acetate, potassium acetate, sodium molybdate, potassium molybdate, sodium borate, ammonium borate, lithium nitrate, sodium nitrate, potassium nitrate, sodium primary phosphate, sodium secondary phosphate, sodium tertiary phosphate, potassium primary phosphate, potassium secondary phosphate, potassium tertiary phosphate, ammonium tertiary phosphate, and sodium polyphosphate. Particularly preferred are potassium acetate, sodium borate, ammonium borate, potassium nitrate, sodium molybdate, potassium molybdate and potassium sulfate. Whether used independently or as a mixture, these water-soluble salts are used in an amount of from about 0.05 to about 2 wt%, preferably from 0.1 to 1 wt%, based on the total weight of the plate protective agent.

If gum arabic is used as the hydrophilic high molecular weight compound to be contained as dissolved in the aqueous phase of the plate protective agent, the pH of the aqueous phase is controlled to be acidic, preferably in the range of from 1 to 5, more preferably from 2 to 4.5. Therefore, if the aqueous phase is not acidic, an acid is used to render it acidic. Acids used for pH adjustment include a mineral acid such as phosphoric acid, sulfuric acid or nitric acid, and an organic acid such as citric acid, tannic acid, malic acid, glacial acetic acid, lactic acid, oxalic acid or p-toluenesulfonic acid. Phosphoric acid is particularly advantageous because it not only functions as an agent to adjust the pH of the aqueous phase but it also prevents staining of the non-image area, is preferably used in an amount of from 0.01 to 8 wt%, preferably from 0.1 to 5 wt%, based on the total weight of the aqueous phase.

A typical example of the method of preparing the plate protective agent of this invention will hereunder be described.

First, a hydrophilic high molecular weight compound is dissolved in water to form an aqueous phase. If necessary, a wetting agent, a water-soluble salt and/or acid is added to the aqueous phase.

Separately from the above, a surfactant is dissolved in an organic solvent to form an oil phase. If necessary, a lipophilic substance is added to the oil phase. The oil phase is added dropwise to the aqueous phase under stirring. A homogenizer is used to promote emulsification of the mixture until the protective agent of this invention is prepared.

While the plate protective agent of this invention can be used with a variety of lithographic printing plates, it is applied with advantage to lithographic printing plates prepared by performing imagewise exposure and development of a presensitized lithographic printing plate (hereinafter referred to PS plate) which comprises an aluminum substrate coated with a photosensitive layer. Preferred examples of the PS plate are: an aluminum substrate coated with a photosensitive layer comprising a mixture of a diazo resin (salt of a condensate of p-diazodiphenylamine with paraformaldehyde) and shellac, as described in British Pat. No. 1,350,521; a negative PS plate comprising an aluminum substrate coated with a photosensitive layer composed of a mixture of a diazo resin and a polymer having a hydroxyethyl methacrylate unit or hydroxyethyl acrylate unit as a predominant repeating unit, as described in British Pat. Nos. 1,460,978 and 1,505,739; a positive PS plate comprising an aluminum substrate coated with a photosensitive layer composed of a mixture of an o-quinonediazide photosensitive material and a novolak phenolic resin, as described in Japanese Patent Application (OPI) No. 125,806/75; a PS plate comprising an aluminum substrate coated with photosensitive layer composed of a photocrosslinkable photopolymer, as described in U.S. Pat. No. 3,860,426; a PS plate comprising an aluminum substrate coated with a photosensitive layer composed of a photopolymerizable photopolymer composition, as described in U.S. Pat. Nos. 4,072,528 and 4,072,527; and a PS plate comprising an aluminum substrate coated with a photosensitive layer composed of a mixture of an azide and a water soluble polymer, as described in British Pat. Nos. 1,235,281 and 1,495,861.

PS plates which are of particular advantage to the object of this invention will hereunder be described in detail.

Aluminum plates which are advantageously used as a substrate include a pure aluminum plate and aluminum alloy plate as well as a plastic film laminated or metallized with aluminum. These aluminum plates are preferably subjected to surface treatement such as graining, immersion in an aqueous solution of sodium silicate, potassium fluorozirconate or phosphate, or anodization. Other advantageous substrates are an aluminum plate of the type described in U.S. Pat. No. 2,714,066 which is grained and thereafter immersed in an aqueous solution of sodium silicate, and an aluminum plate of the type described in U.S. Pat. No. 3,181,461 which is anodized before it is immersed in an aqueous solution of an alkali metal silicate. The anodization is carried out using an aluminum anode in an electrolyte comprising one or more aqueous or nonaqueous solutions of an inorganic acid such as phosphoric acid, chromic acid, sulfuric acid or boric acid, or an organic acid such as oxalic acid or sulfamic acid, or salts thereof.

The technique of electrodeposition with silicate as described in U.S. Pat. No. 3,658,662 can also advantageously be employed in this invention.

Another example of the advantageous substrate is an aluminum plate of the type described in U.S. Pat. No. 4,087,341, Japanese Patent Publication No. 27481/71 and Japanese Patent Application (OPI) No. 30503/77 which is first electrograined and then anodized in the manner described above. A further example is an aluminum plate of the type described in U.S. Pat. No. 3,834,998 which is grained, chemically etched and anodized as described above. These surface treatments are applied not only for the purpose of making the surface of the substrate hydrophilic but also for the purposes of preventing any adverse reaction with the photosensitive composition placed on the substrate and providing strong bond between the substrate and photosensitive layer.

Preferred examples of the composition of the photosensitive layer to be formed on these aluminum substrates include the following:

(1) Compositions composed of diazo resins

Diazo resins which are typified by a condensate of p-diazodiphenylamine and paraformaldehyde may be water soluble or insoluble, and they are preferably insoluble watering and soluble in conventional organic solvents. Particularly preferred diazo compounds are salts of condensate of p-diazophenylamine and formaldehyde or acetaldehyde, such as a compound having two or more diazo groups in its molecule in the form of a phenolate, fluorocaprate or salts of sulfonic acids such as triisopropylnaphthalenesulfonic acid, 4,4-biphenyldisulfonic acid, 5-nitro-orthotoluenesulfonic acid, 5-sulfosalicylic acid, 2,5-dimethylbenzenesulfonic acid, 2-nitrobenzenesulfonic acid, 3-chlorobenzenesulfonic acid, 3-bromobenzenesulfonic acid, 2-chloro-5-nitrobenzenesulfonic acid, 2-fluorocaprylnaphthalenesulfonic acid, 1-naphthol-5-sulfonic acid, 2-methoxy-4-hydroxy-5-benzoylbenzenesulfonic acid and paratoluenesulfonic acid. Other preferred diazo resins include a condensate of 2,5-dimethoxy-4-p-tolyl-mercaptobenzenediazonium and formaldehyde in the form of the salts illustrated above.

Another preferred example is the diazo resin described in British Pat. No. 1,312,925.

While these diazo resins may individually serve as a photosensitive material to be used for preparing a resist, they are preferably used in combination with a binder.

A variety of polymers can be used as the binder. A preferred binder contains a hydroxy, amino, carboxylic acid, amido, sulfone amide, active methylene, thioalcohol, epoxy and other groups. Examples of such preferred binder are: shellac of the type described in British Pat. No. 1,350,521; a polymer of the type described in British Pat. No. 1,460,978 and U.S. Pat. No. 4,125,276 which contains a hydroxyethyl acrylate or hydroxyethyl methacrylate unit as the predominant repeating unit; a polyamide resin of the type described in U.S. Pat. No. 3,751,257; a phenolic resin and a polyvinyl acetal resin such as polyvinyl formal resin or polyvinyl butyral which are of the type described in British Pat. No. 1,074,392; a linear polyurethane resin, polyvinyl alcohol resin esterified with phthalic acid, an epoxy resin prepared by condensing bisphenol A and epichlorohydrin, a polymer containing an amino (meth)acrylate, cellulose such as cellulose acetate, cellulose alkyl ether, cellulose acetate phthalate, which are of the type described in U.S. Pat. No. 3,660,097.

These binders are suitably contained in the photosensitive resist forming composition in an amount of from 40 to 95 wt%. Higher binder content (in other words, lower diazo resin content) of course results in greater sensitivity but this is compromised by low time-dependent stability. Optimum content of the binder is in the range of from about 70 to 90 wt%.

Compositions composed of these diazo resins may optionally contain other additives such as phosphoric acid, dye and pigment as described in U.S. Pat. No. 3,236,646.

(2) Compositions composed of o-quinonediazide compounds

A particularly preferred o-quinonediazide compound is an o-naphthoquinonediazide compound of the type described in U.S. Pat. Nos. 2,766,118; 2,767,092; 2,772,972; 2,859,112; 2,907,665; 3,046,110; 3,046,111; 3,046,115; 3,046,118; 3,046,119; 3,046,120; 3,046,121; 3,046,122; 3,046,123; 3,061,430; 3,102,809; 3,106,465; 3,635,709; 3,647,443; and many other publications. Particularly preferred are o-naphthoquinonediazidosulfonic acid ester or o-naphthoquinonediazidocarboxylic acid ester of aromatic hydroxy compound, and o-naphthoquinonediazidosulfonamide or o-naphthoquinonediazidocarboxylic acid amide of aromatic amino compound. Very effective compounds are a condensate of pyrogallol and acetone esterified with o-naphthoquinonediazidosulfonic acid as described in U.S. Pat. No. 3,635,709; a polyester having a terminal hydroxy group esterified with o-naphthoquinonediazidosulfonic acid or o-naphthoquinonediazidocarboxylic acid as described in U.S. Pat. No. 4,028,111; a homopolymer of p-hydroxystyrene or a copolymer thereof with another copolymerizable monomer which is esterified with o-naphthoquinonediazidosulfonic acid or o-naphthoquinonediazidocarboxylic acid as described in British Pat. No. 1,494,043.

While these o-quinonediazide compounds can be used independently, they are preferably used as a mixture with an alkali-soluble resin. A suitable alkali-soluble resin includes a novolak type phenolic resin such as a phenolformaldehyde resin, o-cresol-formaldehyde resin or m-cresol-formaldehyde resin. More preferably, these phenolic resins are used in combination with a tert-butylphenol-formaldehyde resin which is a condensate of formaldehyde and phenol or cresol substituted by an alkyl group having 3 to 8 carbon atoms, as described in U.S. Pat. No. 4,123,279. These alkalisoluble resins are contained in the photosensitive resist forming composition in an amount of from about 50 to 85 wt%, preferably from 60 to 80 wt%, based on the total weight of said composition.

Photosensitive compositions composed of these o-quinonediazide compounds may optionally contain other additives such as pigment, dye and plasticizer.

(3) Compositions composed of photosensitive azide compounds

A suitable photosensitive azide compound is an aromatic azide compound wherein an azido group is bonded to the aromatic ring either directly or through a carbonyl group or sulfonyl group. Upon exposure to light, the azido group of the compound is decomposed to form nitrene which enters into various reactions that insolubilize the compound. A preferred aromatic azide compound is such that it contains one or more groups such as azidophenyl, azidostyryl, azidobenzal, azidobenzoyl and azidocinnamoyl; specific examples are 4,4′-diazidochalcone, 4-azido-4′-(azidobenzoylethoxy) chalcone, N,N-bis-p-azidobenzal-p-phenylenediamine, 1,2,6-tri(4′-azidobenzoxy)hexane, 2-azido-3-chloro-benzoquinone, 2,4-diazido-4′-ethoxy-azobenzene, 2,6-di-(4′-azidobenzal)-4-methylcyclohexane, 4,4′-diazidobenzophenone, 2,5-diazido-3,6-dichlorobenzoquinone, 2,5-bis(4-azidostyryl)-1,3,4-oxadiazole, 2-(4-azidocinnamoyl)thiophene, 2,5-di(4′-azidobenzal) cyclohexanone, 4,4′-diazidophenylmethane, 1-(4-azidophenyl)-5-furyl-2-penta-2,4-dien-1-one, 1-(4-azidophenyl)-5-(4-methoxyphenyl)-penta-1,4-dien-3-one, 1-(4-azidophenyl)-3-(1-naphthyl)propen-1-one, 1-(4-azidophenyl)-3-(4-dimethylaminophenyl)-propan-1-one, 1-(4-azidophenyl)-5-phenyl-1,4-pentadien-3-one, 1-(4-azidophenyl)-3-(4-nitrophenyl)-2-propen-1-one, 1-(4-azidophenyl)-3-(2-furyl)-2-propene-1-on, 1,2,6-tri(4′-azidobenzoxy)hexane, 2,6-bis-(4-azidobenzylidyene-p-t-butyl)cyclohexanone, 4,4′-diazidodibenzalacetone, 4,4′-diazidostilbene-2,2′-disulfonic acid, 4,4′-di-azidostilbene-α-carboxylic acid, di-(4-azido-2′-hydroxybenzal-)acetone-2-sulfonic acid, 4-azidobenzalacetophenene-2-sulfonic acid, 2-azido-1,4-dibenzenesulfonylaminonaphthalene, or 4,4-diazido-stilbene-2,2′-disulfonic acid anilide.

These low-molecular-weight aromatic diazide compounds may advantageously be replaced by the azido-containing polymer which is illustrated in Japanese Patent Publications Nos. 9047/69; 31837/69; 9613/70; 24915/70; 25713/70; Japanese Patent Application (OPI) Nos. 5102/75; 84302/75; 84303/75; and 12984/78.

The above defined photosensitive azide compounds are preferably used in combination with a polymer which works as a binder. A preferred binder is an alkali-soluble resin. Examples of the alkali-soluble resin include: a natural resin such as shellac or rosin; a novolak type phenolic resin such as phenol-formaldehyde resin or m-cresol-formaldehyde resin; a homopolymer of unsaturated carboxylic acid or a copolymer thereof with another copolymerizable monomer, such as polyacrylic acid, polymethacrylic acid, methacrylic acid-styrene copolymer, methacrylic acid-methyl acrylate copolymer or a styrenemaleic anhydride copolymer; a resin produced by reacting a partial or complete saponification product of polyvinyl acetate with an aldehyde such as acetaldehyde, benzaldehyde, hydroxybenzaldehyde or carboxybenzaldehyde to form partial acetal; and polyhydroxystyrene. Other suitable examples of the binder are organic solvent soluble resins such as cellulose alkyl ethers typified by cellulose methyl ether and cellulose ethyl ether.

The binder is preferably contained in an amount of from about 10 to about 90 wt% based on the total weight of the composition composed of the photosensitive azide compound.

Compositions composed of the photosensitive azide compound may optionally contain a dye, pigment, a plasticizer such as phthalate ester, phosphate ester, aliphatic carboxylic acid ester, glycol or sulfonamide, and a sensitizer such as Michler-ketone, 9-fluorenone, 1-nitropyrene, 1,8-dinitropyrene, 2-chloro-1,2-benzanthraquinone, 2-bromo-1,2-benzanthraquinone, pyrene-1,6-quinone, 2-chloro-1,8-phthaloylnaphthalene, or cyanoacridine.

While the basic structure of the PS plate that is suitable for the purpose of this invention is composed an aluminum substrate overlaid with a photosensitive layer made of the photosensitive materials described above, the photosensitive layer may optionally be coated with one or more resin layers such as specifically described in U.S. Pat. No. 3,136,637 wherein the substrate is overlaid with, in the order written, a photosensitive layer, a lipophilic resin layer, a hydrophobic resin layer, water insoluble resin layer and another layer of resin which is softened by a solvent. A PS plate of similar structure is described in British Pat. Nos. 1,478,333 and 1,478,334 and this structure is also included within the scope of this invention.

The following description illustrates how the plate protective agent of this invention is applied to a PS plate in one preferred embodiment.

First, a PS plate is subjected to imagewise exposure and development to make a lithographic printing plate. Without washing the plate with water, a suitable amount of the plate protective agent is poured on the plate, and a sponge is used to spread the agent to cover the entire surface of the plate. As a result of these procedures, the non-image area of the plate is protected in such a manner that said lithographic printing plate can withstand extended storage. The plate is washed with water to remove the gum before the conventional printing procedure starts.

The protective agent of this invention does not reduce the lipophilicity of the image area of a lithographic plate whereas it is capable of enhancing the hydrophilicity of the non-image area.

The protective agent of this invention works most effectively when it is applied to a lithographic printing plate prepared from the PS plate described in either British Pat. No. 1,460,978 or 1,505,739.

This invention will hereunder be described in greater detail by reference to the following Examples, wherein all percents are by weight.

EXAMPLES 1 TO 6 AND COMPARATIVE EXAMPLES 1 AND 2

A 0.24 mm thick aluminum substrate was degreased by immersion in a 7% aqueous solution of sodium tertiary phosphate at 60° C., and after water washing, a suspension of pumice in water was poured on the substrate while it was grained by rubbing with a nylon brush. After washing with water, the grained substrate was immersed for a period of 30 to 60 seconds in a 5% aqueous solution of sodium silicate JIS No. 3 (molar ratio of $SiO_2$ to $Na_2O$=3.1 to 3.3) which was controlled at 70° C.

After thorough washing with water, the substrate was dried and coated with the following sensitive solution A or B. The substrate coated with either sensitive solution was dried at 100° C. for a period of 2 minutes.

| Sensitive solution A | |
|---|---|
| A copolymer of 2-hydroxyethyl methacrylate (synthesized according to Example 1 of U.S. Pat. No. 4,123,276) | 0.7 g |
| Salt of 2-methoxy-4-hydroxy-5-benzoyl-benzenesulfonic acid with a condensate of p-diazodiphenylamine and paraformaldehyde | 0.1 g |
| Oil Blue 603 (a product of Orient Chemical Industries Co., Ltd.) | 0.03 g |
| 2-Methoxyethanol | 6 g |

-continued

| | |
|---|---|
| Methanol | 6 g |
| Ethylene dichloride | 6 g |
| Sensitive solution B | |
| Sensitive solution A | 18.83 g |
| A half ester of styrene/maleic anhydride (molecular weight: ca. 1500) (molar ratio of styrene to maleic anhydride = 1.5:2:1) | 0.014 g |

Each sensitive solution was applied until the dry coating weight was 2.0 g/$m^2$. The thus prepared photosensitive lightographic printing plates were designated plates A and B, respectively. Each plate was exposed imagewise for a period of 45 seconds to a carbon arc lamp (30 amperes) placed at a distance of 70 cm. Subsequently, the plate was immersed in a developing solution of the following formulation at room temperature for a period of 1 minute, and the surface of the plate was lightly rubbed with absorbent cotton to remove the unexposed area. The products were labelled lithographic printing plates A and B.

| | |
|---|---|
| Sodium sulfite | 3 g |
| Benzyl alcohol | 30 g |
| Triethanolamine | 20 g |
| Monoethanolamine | 5 g |
| Perex NBL (sodium tert-butylnaphthalene-sulfonate manufactured by Kao-Atlas Co., Ltd.) | 30 g |
| Water | 1000 ml |

An aqueous solution C of the following formulation was prepared, a solution D of another formulation set forth below was gradually added to the aqueous solution C under vigorous stirring, and the resulting emulsion was subjected to further emulsification using a homogenizer until the protective agent of this invention was produced.

| | |
|---|---|
| Aqueous solution C | |
| Gum arabic | 4 g |
| Dextrin | 16 g |
| Phosphoric acid (85%) | 0.05 g |
| Water | 75 g |
| Solution D | |
| Sodium dilauryl sulfosuccinate | 1.0 g |
| Dibutyl phthalate | 2.0 g |
| Polyoxyethylene nonylphenyl ether (HLB = 8) | 1.0 g |
| Aliphatic acid ester type surfactant | 1.0 g |

(see Table 1 below)

Without washing the lithographic printing plates with water, a small amount of the thus produced plate protective agent was applied dropwise to the plates and a sponge was used to spread the agent so as to cover the entire surface of each printing plate. The two plates thus treated were designated Plate A and Plate B.

As a control, Plate B was developed, washed with water, excess water was removed by squeegee, a small amount of the protective agent added dropwise and a sponge was used to spread the agent so as to cover the entire surface of the plate, the thus treated plate was designated Plate C.

Subsequently, each plate was washed with water to remove the protective agent from its surface and set on a printing machine for printing. The lipophilicity of the plate was evaluated by counting the number of sheets spoiled before printed matter having satisfactory concentration of printing ink was obtained (said number will hereunder be referred to as the number of wasted sheets). The results of the evaluation are indicated in Table 1 below.

TABLE 1

| Run | Aliphatic acid ester type surfactant | No. of wasted sheets Plate A | Plate B | Plate C |
|---|---|---|---|---|
| Ex. 1 | Sorbitan monopalmitate | 15 | 10 | 10 |
| 2 | Sorbitan monostearate | 15 | 10 | 10 |
| 3 | Sorbitan monooleate | 10 | 5 | 5 |
| 4 | Sorbitan trioleate | 15 | 5 | 5 |
| 5 | Monoglyceride monostearate | 5 | 10 | 10 |
| 6 | Monoglyceride oleate | 10 | 5 | 5 |
| Com. Ex. 1 | None | 40 | 30 | 10 |
| 2 | Protective agent consisted of only Solution C | 80 | 80 | 60 |

Table 1 indicates the high lipophilicity of the protective agent prepared according to this invention. It is to be noted that all the lithographic printing plates treated with the protective agents of Examples 1 to 6 and Comparative Examples 1 and 2 provided printed matter without strain.

EXAMPLES 7 TO 9 AND COMPARATIVE EXAMPLES 3 AND 4

A mechanically grained 2S aluminum substrate was partially etched by immersion in a 2% aqueous solution of sodium hydroxide at 40° C. for a period of 1 minute. After washing with water, the aluminum substrate was immersed in a mixture of sulfuric acid and chromic acid for a period of about 1 minute to expose the surface of pure aluminum. The substrate was then immersed in 20% sulfuric acid at 30° C., and subjected to anodization at a voltage of 1.5 V D.C. and a current density of 3A/$dm^2$, followed by washing with water and drying. Subsequently, a roll coater was used to coat continuously the substrate with a sensitive solution of the following formulation until the dry coating weight was 2 g/$m^2$.

| | |
|---|---|
| Naphthoquinone-1,2-diazide(2)-5-sulfonic acid ester of acetone-pyrrogallol resin (synthesized according to Example 1 of U.S. Pat. No. 3,635,709) | 5 g |
| PR-50530 (tertiary-butylphenol/formaldehyde resin manufactured by Sumitomo Durez Co., Ltd.) | 0.5 g |
| Hitanol 3110 (cresol/formaldehyde resin manufactured by Hitachi Chemical Co., Ltd.) | 5 g |
| Methyl ethyl ketone | 50 g |
| Cyclohexanone | 40 g |

The plate dried at 100° C. for a period of 2 minutes had the performance of a PS plate which could be stored in a cool dark place for a period of 1 year without any significant deterioration in its quality. The thus presensitized lithographic printing plate was set in a vacuum printing frame and exposed to a Fuji Film PS Light (having the 3 KW light source of Toshiba Metal Halide Lamp MU 2000-2-OL and sold by Fuji Photo Film Co., Ltd.) through a positive film for a period of 30 seconds. Subsequently, the place was immersed in a developing solution of the following formulation.

| | |
|---|---|
| Sodium silicate JIS No. 3 | 10 g |
| Aerosol OS (sodium isopropylnaphthalene-sulfonate manufactured by American | 20 g |

-continued

| | |
|---|---|
| Cyanamide Co.) | |
| Benzyl alcohol | 30 g |
| Water added to make | 1000 ml |

The resultant lithographic printing plate was squeegeed and gummed with one of the three plate protective agents of the same formulation as prepared in Example 1 except that they contained different aliphatic acid ester surfactants as indicated in Table 2 below. The plate was also gummed with control protective agents of the formulations indicated in the same Table. Each plate was then dried at 80° C. for a period of 5 minutes. The five printing plates were allowed to stand at a temperature of 20° C. for a period of 7 days, used for printing according to the conventional procedure, and the number of wasted sheets was counted. The results of the counting are shown in Table 2 below.

TABLE 2

| Run | Aliphatic acid ester type surfactant | No. of wasted sheets |
|---|---|---|
| Ex. 7 | Sorbitan monooleate | 10 |
| 8 | Sorbitan tristearate | 5 |
| 9 | Sorbitan trioleate | 5 |
| Com. Ex. 3 | None | 20 |
| 4 | Protective agent consisted of only Solution C | 40 |

The above results show that the plate protective agent of this invention has the advantage of not decreasing the lipophilicity of the image area of a lithographic printing plate.

What is claimed is:

1. An emulsion type protective agent for the surface of a lithographic printing plate comprising an aqueous phase having dissolved therein a hydrophilic high molecular weight compound and an oil phase containing an organic solvent, an alkylphenyl type nonionic surfactant having an HLB less than 14, wherein said alkylphenyl nonionic surfactant is represented by the formula (I)

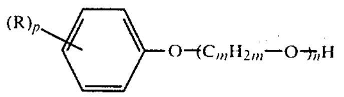

(I)

wherein R is an alkyl group, p is 1 or 2, m is an integer of 1 to 4, and n is an integer of 2 or more, an aliphatic carboxylic acid ester type surfactant and an anionic surfactant.

2. The protective agent of claim 1, wherein said aliphatic carboxylic acid ester type surfactant is an ester of an aliphatic carboxylic acid having 12 to 18 carbon atoms and a polyhydroxy alcohol.

3. The protective agent of claim 2, wherein said aliphatic carboxylic acid ester type surfactant is an aliphatic acid sorbitan type surfactant or an aliphatic acid glycerine type surfactant.

4. The protective agent of claim 3, wherein said aliphatic carboxylic acid ester type surfactant is selected from the group consisting of sorbitan monopalmitate, sorbitan monostearate, sorbitan tristearate, sorbitan monooleate, sorbitan trioleate, monoglyceride-stearate, monoglycerideoleate, glycerol monostearate, and glycerol monooleate.

5. The protective agent of claim 4, wherein said aliphatic carboxylic acid ester type surfactant is selected from the group consisting of sorbitan monooleate, sorbitan monostearate and monoglyceride stearate.

6. The protective agent of claim 1, wherein the total amount of surfactants in the oil phase is about 1 to 15% based on the total weight of the protective agent.

7. The protective agent of claim 1, wherein the proportion of the alkylphenyl nonionic surfactant to anionic surfactant is about 10:1 to 1:10 and the proportion of the alkylphenyl type nonionic surfactant to the aliphatic carboxylic acid ester type surfactant is about 10:1 to 1:10.

8. The protective agent of claim 1, wherein said alkylphenyl nonionic surfactant is selected from the group consisting of polyoxymethylene octylphenyl ether, polyoxymethylene nonylphenyl ether, polyoxymethylene cetylphenyl ether, polyoxymethylene laurylphenyl ether, polyoxyethylene octylphenyl ether, polyoxyethylene nonylphenyl ether, polyoxyethylene decylphenyl ether, polyoxyethylene laurylphenyl ether, polyoxypropylene octylphenyl ether, polyoxypropylene nonylphenyl ether, polyoxypropylene decylphenyl ether, polyoxypropylene laurylphenyl ether, polyoxypropylene cetylphenyl ether, polyoxybutylene octylphenyl ether, polyoxybutylene nonylphenyl ether, polyoxybutylene decylphenyl ether, polyoxybutylene laurylphenyl ether, polyoxybutylene cetylphenyl ether, and polyoxyethylene dinonylphenyl ether all having an HLB less than 14.

9. The protective agent of claim 8, wherein said alkylphenyl nonionic surfactant is polyoxyethylene nonylphenyl ether or polyoxyethylene octylphenyl ether.

10. The protective agent of claim 1, wherein said anionic surfactant is an aliphatic acid salt, an alkyl sulfate ester, an alkylbenzenesulfonate, an alkylnaphthalenesulfonate, a dialkylsulfosuccinate ester, an alkylphosphate ester, a condensate of naphthalene sulfonic acid and formalin, or a polyoxyethylene alkylsulfate ester.

11. The protective agent of claim 10, wherein said anionic surfactant is a dialkylsulfosuccinate.

12. The protective agent of claim 11, wherein said dialkylsulfosuccinate is selected from the group consisting of sodium dihexylsulfosuccinate, sodium di(2-ethylhexyl)-sulfosuccinate, sodium dinonylsulfosuccinate and sodium dilaurylsulfosuccinate.

13. The protective agent of claim 1, wherein the total amount of said nonionic and said anionic surfactant is about 0.5 to about 10 weight % based on the weight of the protective agent.

14. The protective agent of claim 1, wherein the proportion of said nonionic surfactant to said anionic surfactant is about 10:1 to 1:10.

15. The protective agent of claim 1, wherein said organic solvent is a plasticizer which solidifies at a temperature less than 15° C. and boils at a temperature higher than 300° C. at atmospheric pressure.

16. The protective agent of claim 1, wherein said organic solvent is a solvent insoluble in water.

17. The protective agent of claim 1, wherein said solvent is present in an amount of about 0.1 to 10 weight % based on the weight of the protective agent.

18. The protective agent of claim 1, wherein said oil phase additionally contains a lipophilic substance which enhances the stability of the emulsion.

19. The protective agent of claim 1, wherein said hydrophilic polymer is selected from the group consisting of dextrin, gum arabic, an aliginate, a water-soluble cellulose, polyvinyl alcohol, polyvinyl pyrrolidone, polyacrylamide, an acrylamide copolymer vinylmethyl ether-maleic anhydride copolymer, and vinyl acetate-maleic anhydride copolymer.

20. The protective agent of claim 19, wherein said hydrophilic polymer is selected from the group consisting of gum arabic, dextrin, polyvinyl pyrrolidone, carboxymethyl cellulose and polyvinyl alcohol.

21. The protective agent of claim 20, wherein said hydrophilic polymer is gum arabic.

22. The protective agent of claim 1, wherein said hydrophilic polymeric compound is present in an amount of about 5 to 40 weight % based on the weight of the plate protective agent.

23. The protective agent of claim 1, wherein said aqueous phase additionally contains a wetting agent.

24. The protective agent of claim 23, wherein said wetting agent is a polyhydric alcohol.

25. The protective agent of claim 1, wherein said aqueous phase additionally contains a water soluble salt.

26. In a gumming process which comprises coating a protective solution on a lithographic printing plate consisting of a non-image area which retains water and repels a greasy printing ink, and an image-area which repels water and accepts said greasy printing ink, wherein said protective solution comprises an oil phase comprising an organic solvent dissolving a surfactant and an aqueous phase having dissolved therein a hydrophilic high molecular weight compound, the improvement wherein the said oil phase contains a combination of an alkylphenyl type nonionic surfactant having an HLB less than 14, an aliphatic carboxylic acid ester type surfactant and an anionic surfactant, wherein said alkylphenyl nonionic surfactant is represented by the formula (I)

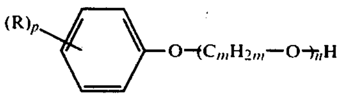

(I)

wherein R is an alkyl group, p is 1 or 2, m is an integer of 1 to 4, and n is an integer of 2 or more.

27. The process of claim 26, wherein said lithographic printing plate is prepared from a presensitized plate.

28. The process of claim 26, wherein said aliphatic carboxylic acid ester surfactant is an aliphatic acid sorbitan type surfactant or an aliphatic acid glycerine type surfactant.

29. The process of claim 28, wherein said aliphatic carboxylic acid ester type surfactant is selected from the group consisting of sorbitan monopalmitate, sorbitan monostearate, sorbitan tristearate, sorbitan monooleate, sorbitan trioleate, monoglyceridestearate, monoglycerideoleate, glycerol monostearate, and glycerol monooleate.

30. The process of claim 29, wherein said aliphatic carboxylic acid ester type surfactant is selected from the group consisting of sorbitan monooleate, sorbitan monostearate and monoglyceridestearate.

31. The process of claim 26, wherein said amount of surfactant(s) in the oil phase is about 1 to 15% based on the total weight of the protective solution.

32. The process of claim 31, wherein the proportion of the alkylphenyl nonionic surfactant to anionic surfactant is about 10:1 to 1:10 and the proportion of the alkylphenyl type nonionic surfactant to the aliphatic acid ester type surfactant is about 10:1 to 1:10.

33. The process of claim 26, wherein said alkylphenyl nonionic surfactant is selected from the group consisting of polyoxymethylene octylphenyl ether, polyoxymethylene nonylphenyl ether, polyoxymethylene cetylphenyl ether, polyoxymethylene laurylphenyl ether, polyoxyethylene octylphenyl ether, polyoxyethylene nonylphenyl ether, polyoxyethylene decylphenyl ether, polyoxyethylene laurylphenyl ether, polyoxypropylene octylphenyl ether, polyoxypropylene nonylphenyl ether, polyoxypropylene decylphenyl ether, polyoxypropylene laurylphenyl ether, polyoxypropylene cetylphenyl ether, polyoxybutylene octylphenyl ether, polyoxybutylene nonylphenyl ether, polyoxybutylene decylphenyl ether, polyoxybutylene laurylphenyl ether, polyoxybutylene cetylphenyl ether, and polyoxyethylene dinonylphenyl ether all having an HLB less than 14.

34. The process of claim 33, wherein said alkylphenyl nonionic surfactant is polyoxyethylene nonylphenyl ether or polyoxyethylene octylphenyl ether.

35. The process of claim 26, wherein said anionic surfactant is an aliphatic acid salt, an alkyl sulfate ester, an alkylbenzenesulfonate, an alkylnaphthalenesulfonate, dialkylsulfosuccinate ester, an alkylphosphate ester, a condensate of naphthalene sulfonic acid and formalin, or a polyoxyethylene alkylsulfate ester.

36. The process of claim 35, wherein said anionic surfactant is an dialkylsulfosuccinate.

37. The process of claim 36, wherein said dialkylsulfonsuccinate is selected from the group consisting of sodium diethylsulfosuccinate, sodium di(2-ethylhexyl)-sulfosuccinate, sodium dinonylsulfosuccinate and sodium dilaurylsulfosuccinate.

38. The process of claim 32, wherein the total amount of said nonionic and said anionic surfactant is about 0.5 to about 10 weight % based on the weight of the protective solution.

39. The process of claim 32, wherein the proportion of said nonionic surfactant to said anionic surfactant is about 10:1 to 1:10.

40. The process of claim 26, wherein said organic solvent is a plasticizer which solidifies at a temperatures less than 15° C. and boils at a temperature higher than 300° C. at atmospheric pressure.

41. The process of claim 40, wherein said plasticizer is present in an amount of about 0.1 to 10 weight % based on the weight of the protective solution.

42. The process of claim 26, wherein said oil phase additionally contains a lipophilic substance which enhances the stability of the emulsion.

43. The process of claim 6, wherein said hydrophilic polymer is selected from the group consisting of dextrin, gum arabic, an alginate, a water-soluble cellulose, polyvinyl alcohol, polyvinyl pyrrolidone, polyacrylamide, an acrylamide copolymer, vinylmethyl ether-maleic anhydride copolymer, and vinyl acetate-maleic anhydride copolymer.

* * * * *